United States Patent [19]
Jang et al.

[11] Patent Number: 5,674,784
[45] Date of Patent: Oct. 7, 1997

[54] METHOD FOR FORMING POLISH STOP LAYER FOR CMP PROCESS

[75] Inventors: Syun-Ming Jang; Chen-Hua Yu, both of Hsin-chu, Taiwan

[73] Assignee: Taiwan Semiconductor Manufacturing Company, Ltd., Hsin-chu, Taiwan

[21] Appl. No.: 720,638

[22] Filed: Oct. 2, 1996

[51] Int. Cl.$^6$ ................................................ H01L 21/316
[52] U.S. Cl. ..................... 437/195; 437/228; 437/235; 156/636.1; 156/662.1
[58] Field of Search ....................... 437/195, 228, 437/228 PL, 235, 238; 156/628.1, 662.1, 636.1

[56] References Cited

U.S. PATENT DOCUMENTS

| 4,438,556 | 3/1984 | Komatsu et al. | 156/628.1 |
| 5,246,884 | 9/1993 | Jaso et al. | 437/225 |
| 5,593,919 | 1/1997 | Lee et al. | 437/195 |

FOREIGN PATENT DOCUMENTS

| 60-111437 | 6/1985 | Japan | 437/235 |
| 60-148139 | 8/1985 | Japan | 156/628.1 |
| 637066 | 2/1995 | Japan | 156/628.1 |

OTHER PUBLICATIONS

S. Wolf, "Silicon Processing For The VLSI Era" vol. 2, Lattice Press, Sunset Beach, CA, pp. 196, 214–215, 234.

*Primary Examiner*—Charles L. Bowers, Jr.
*Assistant Examiner*—Matthew Whipple
*Attorney, Agent, or Firm*—George O. Saile; Stephen B. Ackerman

[57] ABSTRACT

A method is disclosed for planarizing interlevel dielectric layers in semiconductor wafers extremely smoothly. The key aspect of the disclosure is a buried stop layer that is ion implanted into the interlevel layer. It is shown that the stop layer can be formed at precise depths from the surface of the oxide layer and in a mostly planar surface. When the oxide layer with the buried stop layer is chemical/mechanically polished in the conventional manner, polishing stops at the stop layer yielding also a planar surface. The planarity of the polished surface can be extremely refined by first forming an extremely refined stop layer. The latter is accomplished by first planarizing the surface of the oxide layer in a number of ways before implanting the stop layer. It is further shown that when nitrogen atoms are used as the species for implanting, the resulting stop layer acquires a hardness very favorable for being differentiated from the softer oxide layer. Such abrupt difference in hardness provides a very precise polishing endpoint. At the same time, overpolishing of the interlevel layer is avoided.

40 Claims, 5 Drawing Sheets

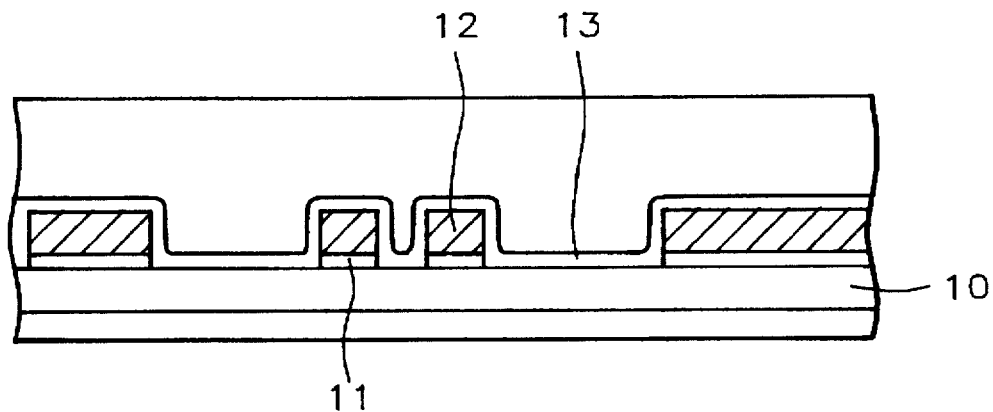
FIG. 1a - Prior Art
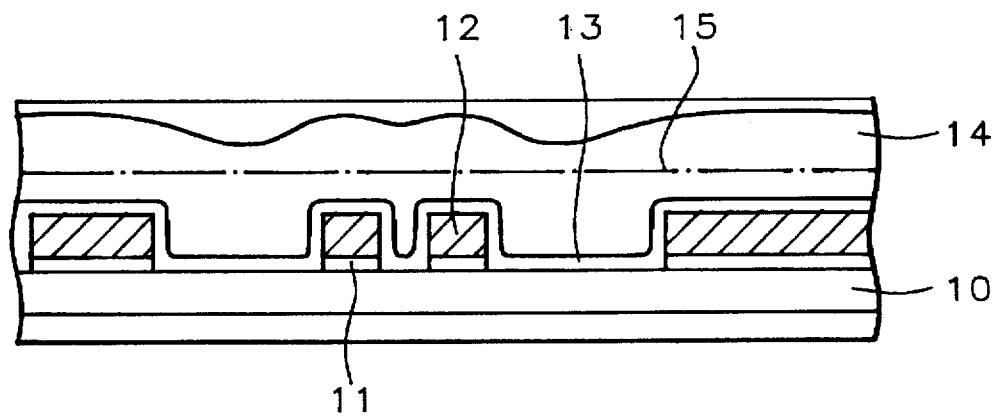
FIG. 1b - Prior Art
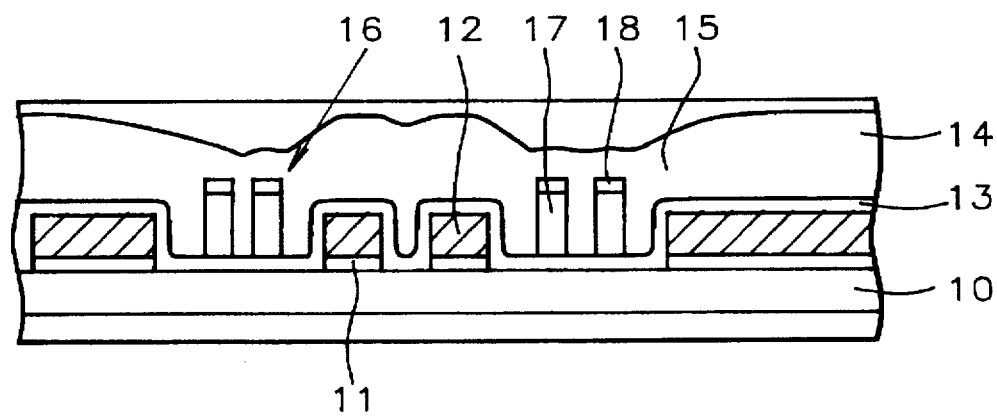
FIG. 1c - Prior Art

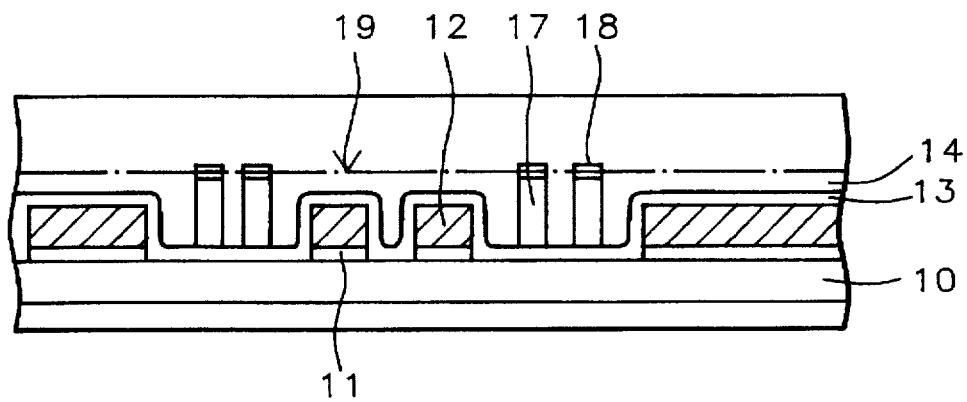
FIG. 1d – Prior Art
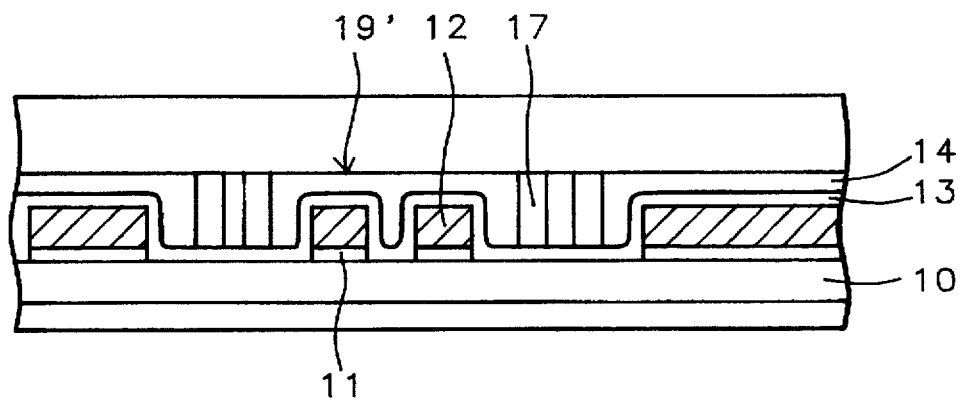
FIG. 1e – Prior Art
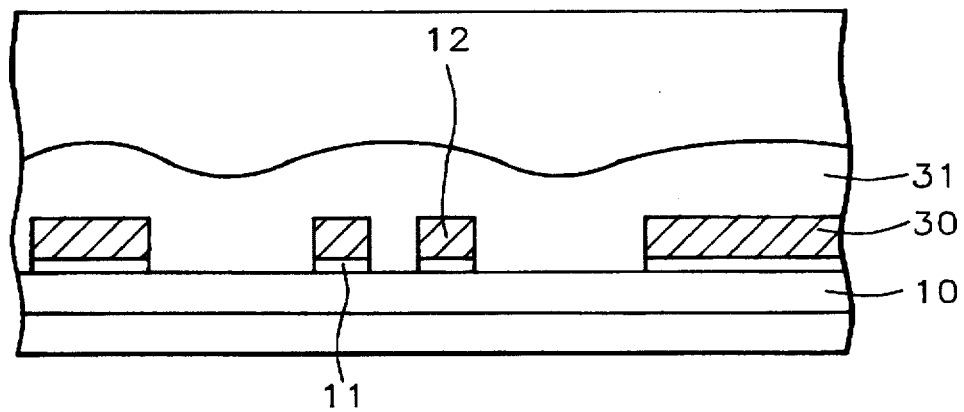
FIG. 2a – Prior Art

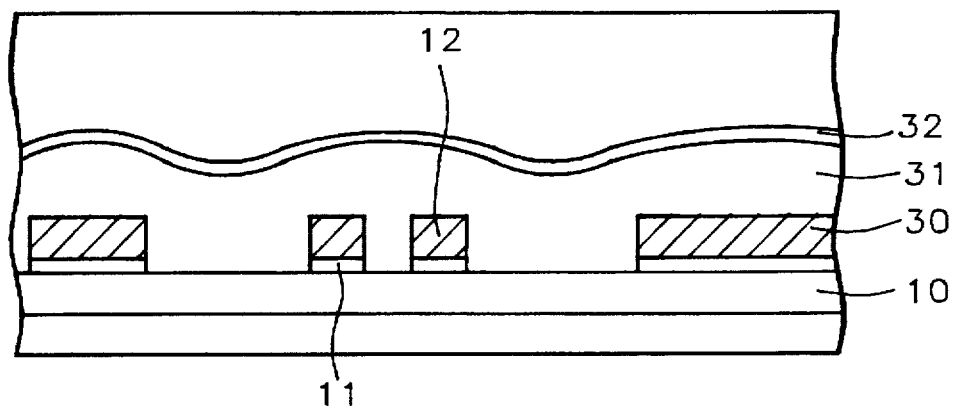
FIG. 2b – Prior Art
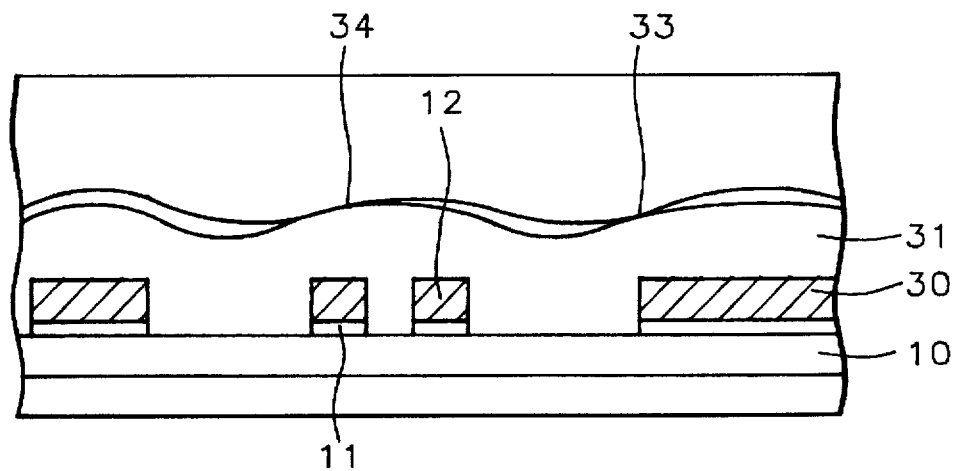
FIG. 2c – Prior Art
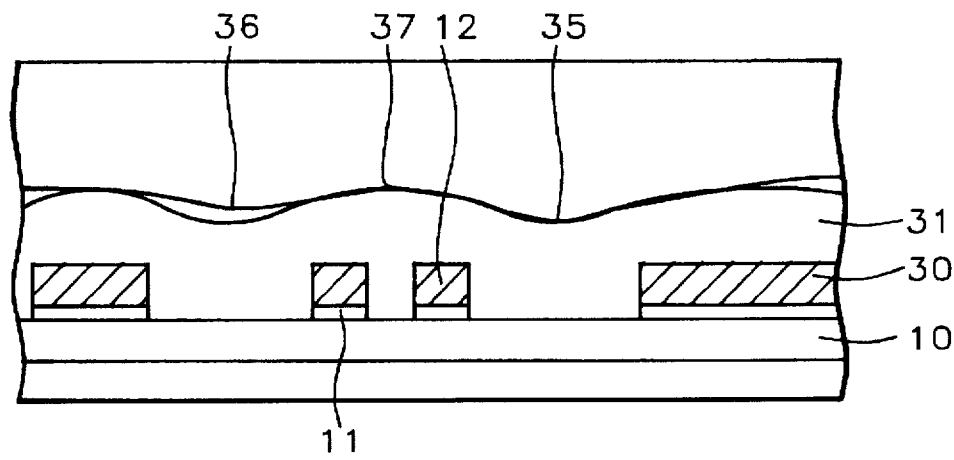
FIG. 2d – Prior Art

METHOD FOR FORMING POLISH STOP LAYER FOR CMP PROCESS

BACKGROUND OF THE INVENTION

(1) Field of the Invention

The invention relates generally to semiconductor manufacturing, and more particularly, to a method for making planar interlevel dielectric surfaces, using chemical/mechanical polishing (CMP) and a hard ion implanted layer to act as a polishing stop.

(2) Description of the Related Art

Integrated circuits are manufactured on silicon substrates by depositing layers upon layers of different materials, and one after another in a serial fashion within precise specifications. Each conductive layer is separated and insulated from each other by means of interlevel dielectric (ILD) insulating materials. Since each conductive layer consists of features and facets, e.g., metal lines of irregular shapes and dimensions, such features and irregularities manifest themselves as "bumps" or "steps" through the covering interlevel material. When such layers are added on top of one another, steps of progressively higher dimensions are produced. As it will be apparent to those skilled in the art, this is exacerbated even more as the number of levels in the interconnect technology is increased in today's sub-micron technology. The resulting unevenness or the irregular nature of surfaces ultimately lead to reliability problems due to the difficulty of depositing metal on such non-planar surfaces.

There is thus a need to planarize the interlevel or ILD surfaces. For this purpose, and relatively recently, an improved planarization method known as chemical/mechanical polishing, or CMP, has been introduced. More commonly, though, planarization in semiconductor manufacturing has typically been accomplished by such techniques as BPSG reflow, planarization with resist, or SOG planarization. In BPSG reflow, a layer of borophosphosilicate (BPSG) glass is deposited and then heated to a temperature of greater than 900° C. The heating step causes this material to soften and flow, providing a smoother surface as described, for example, in S. Wolf, "Silicon Processing for the VLSI Era," vol. 2, Lattice Press, Sunset Beach, Calif., 1990, p. 196. However, the temperatures used in this process are too high if aluminum, the most common metallization material, has already been deposited on the wafer. Also, BPSG reflow is most effective for narrow indentations, that is, very small areas of the ILD surface. Broad indentations and spaces in the surface are not made planar, and thus BPSG reflow does not provide for adequate "global" planarization (planarization across the entire wafer surface).

A second planarization technique is planarization with resist or "resist etchback". One drawback to the etchback process is that a thicker ILD film must be deposited than will ultimately remain, since some is removed during the etchback step as described in S. Wolf, "Silicon Processing for the VLSI Era," vol. 2, Lattice Press, Sunset Beach, Calif., 1990, p. 234. Also, this technique requires more process steps in addition to typically requiring that the dielectric and resist have similar etch rates, which is difficult to accomplish and control.

In the SOG planarization process, the method requires the curing of spin-on-glass (SOG) layer, which converts the SOG to silicon dioxide. However, contaminants result when the structure is heated to greater than 300° C., which evolve and corrode the aluminum vias.

To overcome some of the problems cited above, the more recent CMP planarization technique has been gaining wide acceptance. Here, a semiconductor wafer is held and rotated against a polishing surface, on which there is a polishing slurry containing abrasive material such as alumina or silica. At the same time, a chemical etchant may be introduced so that material is removed from the wafer by both chemical and mechanical means.

One of the problems associated with CMP is the determination of when the planarization is complete and, therefore, when to stop polishing. In prior art, there are methods to detect the planarization endpoint using the frictional difference between two materials. There are other methods that employ capacitive measurements of the dielectric thickness for insitu endpoint detection. Still another method uses a laser interferometry as described in S. Wolf, "Silicon Processing for the VLSI Era," vol. 1, Lattice Press, Sunset Beach, Calif., 1990, pp. 565–566.

Since mechanical polishing is accomplished by abrading the surface of a material by a slurry of particles of another material, methods have been devised to take advantage of the difference in the hardness of materials to detect when to stop polishing the given surface. Thus, in FIG. 1a, a cross-section of a semiconductor wafer is shown whose rugged surface is formed by conductive wiring lines (12) which are insulated from the wafer by means of dielectric film (11) and also covered with a blanket interlayer insulation film (13) of oxide or nitride. Before the next wiring layer can be deposited, the spaces between the wiring lines must be filled, and furthermore, the resulting surface must be planarized. As mentioned earlier, planarization is needed for otherwise, as additional wiring layers are stacked on top of one another, the layers will progressively be more rugged resulting in reliability problems. One of the commonly used techniques in prior art is to spin onto the wafer surface, silicate glass, for example, in an amount slightly more than needed as shown in FIG. 1b, and then etch back the same spin-on-glass (SOG) (14) to a predetermined level (15). Though the resulting surface is usually planar and smooth, it is difficult to determine when to stop etching back the SOG. It will be known to those skilled in the art that variability in the thickness of layers will cause separate reliability and functionality problems.

Therefore, prior to spinning SOG onto the wafer (10), posts (16) are deposited in the wider areas between the wiring lines as shown in FIG. 1c. Said post structures usually consist of two different insulating materials of different hardnesses, where top layer (18) is harder than bottom layer (17). The harder top layer (18) is sometimes referred to as "stop island". Said layers are deposited one on top of one another employing techniques which are well known in the art and as they are not significant to the invention, will not be described in detail here. Wafer (10) is then blanket spun with SOG (14) as shown in FIG. 1c and then subjected to chemical/mechanical polishing for planarization of the top surface. As the wafer is held and rotated against a polishing surface, dielectric (14) is removed at a certain rate commensurate with its hardness until polishing reaches the stop islands (18). As the polishing rate of the harder stop islands is relatively slow compared to the rate of the surrounding dielectric, the polishing will stop as the wafer surface reaches the level of the top hard film of the polishing stop island. Due to presence of chemical etchant in CMP, surface (19) of the now planar layer (14) will be slightly lower than the top of stop island (18) as shown in FIG. 1d. This hard film layer (18) is removed by either dry or wet chemical etching techniques or, for example, ion-beam-assisted etching for a diamond film as are well-known in the art yielding planarized surface 19' of FIG. 1e.

There are several possible combinations of hardnesses of the materials used for the top hard film, the polishing slurry, and the dielectric. The polishing slurry hardness must always be greater than that of the dielectric, in order for the mechanical polishing to take place. If the material chosen for the top hard film has a hardness that is greater than that of the polishing slurry (for instance, a diamond film harder than an aluminum-oxide slurry), the hard film layer will inhibit further polishing when the polishing surface reaches the hard film. The thickness of the hard film layer may kept to a minimum in this instance, which will improve the overall planarization after the hard film is removed.

In prior art, the hardness of the hard film layer material could also be chosen to be between that of the slurry and dielectric. As long as the hard film hardness is much greater than that of the dielectric, endpoint detection is not needed. The completion of polishing is controlled by monitoring the polishing time. Since the slurry will also polish the hard film later, though at a slower rate than the dielectric, a thicker hard film layer is required to provide sufficient process latitude. If the hard film hardness is close to that of the dielectric, then a combination of the hard film layer and endpoint detection could be used to planarize wafer.

In place of using isolated "hard" top islands as describe above, there is the additional prior art where a relatively hard material is blanket deposited over the entire surface of the wafer layer to be planarized. In U.S. Pat. No. 5,246,884, a diamond-like carbon (DLC) film is blanket deposited and used as a CMP etch stop. It is disclosed in said patent that a semiconductor substrate having disposed thereon conductive wiring lines and pads comprised of aluminum-based ally, such as Al—Cu, is sputter coated with about 1 micron of a doped or non-doped glass such as oxide $SiO_2$ such that the entire substrate surface including wiring lines, pads and any other surface features are coated with a layer of the glass. A layer comprising chemical vapor deposited (CVD) diamond or DLC is deposited overall and the device is chemical/mechanical polished for a time sufficient to achieve planarity. It is claimed in said patent that because of the their greater hardness in relation to that of the oxide, diamond and DLC make endpoint detection in the polishing process controllable.

Although in each one of the prior methods described above the objective is to achieve a smooth and planarized surface, because the polishing stop layers—may they be in the form of "islands" or "blanket"—are inherently not flat and planar to start with, it is found in the practice of manufacturing that resulting surfaces are also not completely flat or planarized. Therefore, what is needed is a polishing stop layer which itself is flat and planar at the outset so that when polishing has reached and stopped against that flat stop layer, the resulting surface is completely planarized. It will be seen in the disclosure of the present invention that such an approach and methodology is possible.

SUMMARY OF THE INVENTION

It is therefore an object of this invention to provide a method for planarizing surfaces on semiconductor wafers.

It is another object of this invention to provide a semiconductor device having interlevel planarity.

It is another object of this invention to provide a planar surface on a semiconductor wafer by using a buried and relatively planar stop layer in chemical/mechanical etching/polishing of said wafer.

It is still another object of this invention to provide a method for ion implanting a relatively planar and hard stop layer into the layer to be planarized.

These and other objects are achieved according to the present invention by providing a semiconductor substrate having topographical features that are covered with an oxide insulating material; depositing on said insulating material a planarizing material, preferably spin-on-glass (SOG); and then ion-implanting hard layer of preferably, nitrogen atoms into said oxide layer; chemical/mechanical etching/polishing until hard stop layer is removed.

In an alternate embodiment, after the step of spinning and curing, said SOG is polished for a short prescribed time in a slurry and with a polishing pad such that the surface is planarized very smoothly. Then ion-implanting of said hard layer is accomplished at precise depths from said planarized surface to yield planar stop layer. The planarization is completed by chemical/mechanical etching/polishing until hard stop layer is removed.

BRIEF DESCRIPTION OF THE DRAWINGS

The objects and features of this invention will become apparent more readily from a reading of the detailed description in conjunction with the drawings that follow:

FIGS. 1a–1e are sectional views showing forming of islands of a conventional stop layer in chemical/mechanical polishing (CMP) of a semiconductor wafer.

FIGS. 2a–2d are sectional views showing forming of a conventional continuos stop layer in chemical/mechanical polishing (CMP) of a semiconductor wafer.

DESCRIPTION OF THE PREFERRED EMBODIMENTS

Figure 3A:
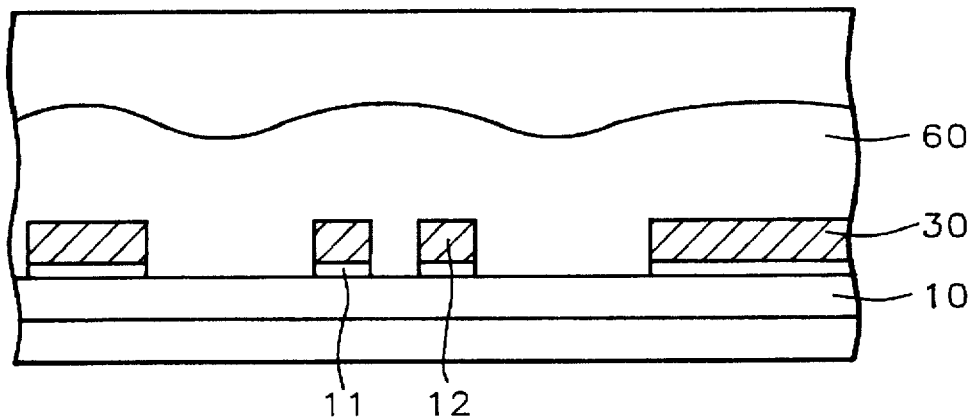
FIGS. 3a–3e are sectional views showing forming of a buried stop layer according to this invention in chemical/mechanical polishing (CMP) of a semiconductor wafer.
Figure 3B:
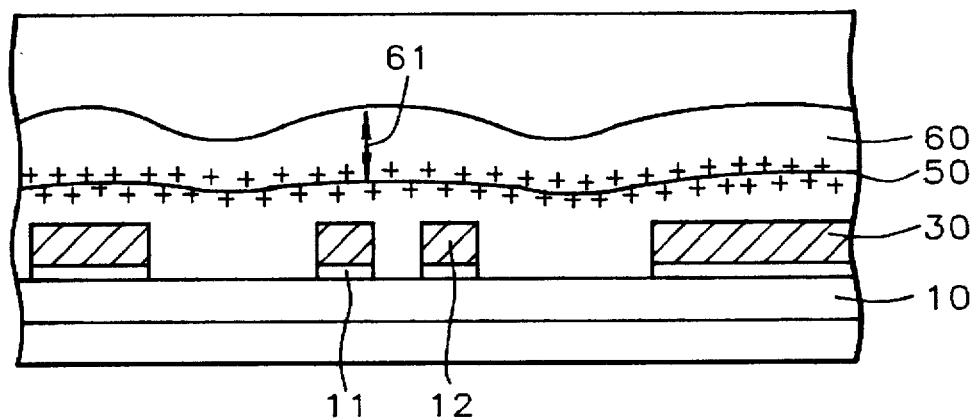
Figure 3C:
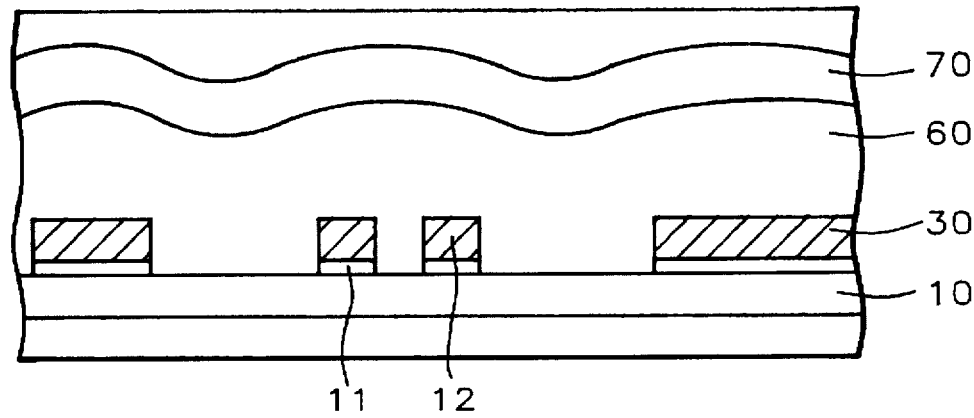

Referring now to the drawings, FIGS. 2a–2d are shown to illustrate the transition from prior art to the methodology disclosed in this invention and depicted in FIGS. 3a–3c. In FIG. 2a, wafer (10) is provided with wiring layer (30) thereon. Said wiring layer (30) is covered with interlayer oxide (31) following the well known techniques and processes of prior art. In order to planarize oxide layer (31) by means of chemical/mechanical polishing, a stop layer (32) is deposited to detect the end of polishing. Layer (32) shown in FIG. 2b is a material harder than the oxide layer. Preferred materials are nitrides, such as silicon nitride or boron nitride. It will be appreciated that stop layer (32) replicates conformably the underlying topography as shown in FIG. 2b. Consequently, when wafer surface is chemical/mechanical polished against a surface as described previously, first "high" points (33) and (34) are abraded as shown in FIG. 2c. Further polishing flattens out the high points, but at the same time, causes overpolishing areas such as (35) shown in FIG. 2d. After the removal of residues (36) of stop layer, the resulting surface (37) is far from being planarized and smooth.

It will be obvious to those skilled in the art that because of the gross nonplanarities in stop layer (32) in the first place that the resulting surface in FIG. 2d is also nonplanar. In other words, in order to end up with a surface which is planar and smooth, the stop layer too must be planar and smooth. In the present invention, such a stop layer is provided thusly: referring now to FIGS. 3a–3e, and specifically to FIG. 3b, there is shown stop layer (50), which in this critical step of the invention, is ion implanted rather than deposited as an improvement over prior art. The improvement is achieved by being able to introduce a desired atomic species into oxide layer (60) in FIG. 3a at specific depths (61) so as to form a stop layer that is planar and of a specific hardness.

In the preferred embodiment of the invention, the species that are implanted are nitrogen ions with the important property that they form a hard stop layer with a hardness of between about 8 to 9 in the Mohs scale. As is known in the field, this value compares favorably with the hardness value of the surrounding oxide layer (60) in FIG. 3b which normally is as low as between about 6 to 7 in the Mohs scale.

Implanting is accomplished by means of high-energy implanter providing 400 keV nitrogen atoms with a dose of between about 2 to $5 \times 10^{14}$ ions/cm$^2$. In order to achieve a predetermined depth of between about 9,000 angstroms (Å) to 11,000 Å, the implantation time is set between about 50 seconds to 70 seconds.

Figure 3D:
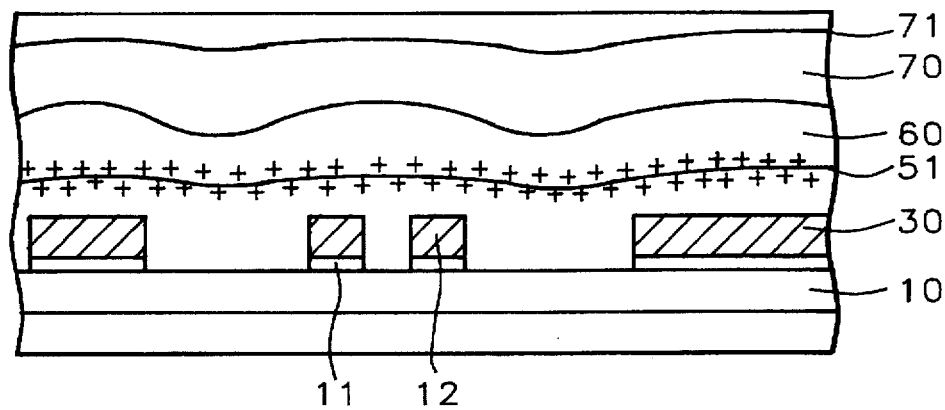
Figure 3E:
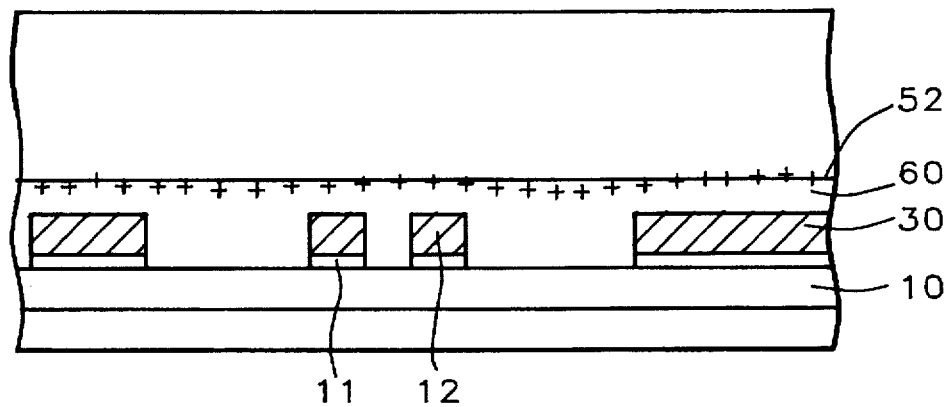

Although the depth of the implanted species may be adjusted as a function of the intervening oxide layer through which the atoms must travel, it will be appreciated that the planar and smoother the surface through which the atoms are driven, the planar will be the surface of their arrival within oxide layer (60). Hence, in another embodiment, it is preferred that prior to ion implantation of stop layer (50), the oxide surface is planarized by means of spinning SOG (70) thereon as shown in FIG. 3c, and as described previously. The resulting stop layer (51) of FIG. 3d is more planarized than the previously said stop layer (50) of FIG. 3b. In still a further improvement, prior to ion implantation, said planarized surface (71) in FIG. 3d is even more planarized by subjecting it to chemical/mechanical polishing (CMP). It will be noted that besides providing a initially planarized surface for ion implantation, SOG also provides a smoother surface which facilitates CMP. Thus, having achieved an even more planarized and smooth wafer surface (not shown), stop layer (52) is ion implanted with the preferred parameters stated earlier. Chemical/mechanical polishing is then performed to remove SOG residue and oxide layer to a controlled depth until hard stop layer (52) is reached as shown in FIG. 3(e). The polishing slurry is preferably comprised of SiO$_2$ particles with sizes ranging between about 800 to 1200 Å in a potassium hydroxide KOH, or NH$_4$OH based solution. Also, the preferred polish rate is between about 2000 to 3000 Å/min. It will be appreciated by those skilled in the art that the substantial difference between the hardness of the stop layer and that of the oxide layer will indicate a firm and more precise end to polishing. At the same time, because of the extreme planarity of stop layer (52), overpolishing is avoided.

While the invention has been particularly shown and described with reference to the preferred embodiments thereof, it will be understood by those skilled in the art that various changes in form and details may be made without departing from the spirit and scope of the invention.

What is claimed is:

1. A method of forming a polish stop layer for chemical/mechanical polishing (CMP) of semiconductor wafers comprising the steps of:

providing a wiring layer comprising aluminum on said wafer;

providing an oxide layer on said wiring layer;

ion implanting atoms in said oxide layer to form a polish stop layer; and chemical/mechanical polishing (CMP) said oxide layer.

2. The method of claim 1, wherein said wiring layer is aluminum-copper.

3. The method of claim 1, wherein said oxide layer is silicon oxide.

4. The method of claim 1, wherein said ion implanting is accomplished by means of high-energy implanter.

5. The method of claim 1, wherein said atoms are nitrogen.

6. The method of claim 5, wherein energy of said nitrogen atoms is between about 350 to 450 keV.

7. The method of claim 5, wherein the dose of said nitrogen atoms is between about $2 \times 10^{14}$ to $5 \times 10^4$ ions/cm$^2$.

8. The method of claim 5, wherein duration for implanting said nitrogen atoms is between about 50 to 70 seconds.

9. The method of claim 5, wherein implanting depth of said nitrogen atoms is between about 9000 to 11000 angstroms (Å).

10. The method of claim 1, wherein said polish stop layer has a hardness between about 8 to 9 in Mohs scale.

11. The method of claim 1, wherein said CMP is accomplished with a slurry.

12. The method of claim 11, wherein said slurry consists of SiO$_2$ particles.

13. A method of forming a polish stop layer for chemical/mechanical polishing (CMP) of semiconductor wafers comprising the steps of:

providing a wiring layer comprising aluminum on said wafer;

providing an oxide layer on said wiring layer;

depositing a planarizing glass layer on said wiring layer;

ion implanting atoms in said oxide layer to form a polish stop layer; and chemical/mechanical polishing (CMP) said oxide layer.

14. The method of claim 13, wherein said wiring layer is aluminum-copper.

15. The method of claim 13, wherein said oxide layer is silicon oxide.

16. The method of claim 13, wherein said glass is spin-on-glass (SOG).

17. The method of claim 16 wherein said SOG is cured at a temperature between about 390° to 430° C.

18. The method of claim 13, wherein said ion implanting is accomplished by means of high-energy implanter.

19. The method of claim 13, wherein said atoms are nitrogen.

20. The method of claim 19, wherein energy of said nitrogen atoms is between about 350 to 450 keV.

21. The method of claim 19, wherein the dose of said nitrogen atoms is between about $2 \times 10^4$ to $5 \times 10^4$ ions/cm$^2$.

22. The method of claim 19, wherein duration for implanting said nitrogen atoms is between about 50 to 70 seconds.

23. The method of claim 19, wherein implanting depth of said nitrogen atoms is between about 9,000 to 11,000 angstroms (Å).

24. The method of claim 13, wherein said polish stop layer has a hardness between about 8 to 9 in Mohs scale.

25. The method of claim 13, wherein said CMP is accomplished with a slurry.

26. The method of claim 25 wherein said slurry consists of SiO$_2$ particles.

27. A method of forming a polish stop layer for chemical/mechanical polishing (CMP) of semiconductor wafers comprising the steps of:

providing a wiring layer on said wafer;

providing an oxide layer on said wiring layer;

depositing a planarizing glass layer on said wiring layer;

chemical/mechanical polishing (CMP) of said glass layer;

ion implanting atoms in said oxide layer to form a polish stop layer; and chemical/mechanical polishing (CMP) said oxide layer.

28. The method of claim 27, wherein said wiring layer is aluminum-copper.

29. The method of claim 27, wherein said oxide layer is silicon oxide.

30. The method of claim 27, wherein said glass is spin-on-glass (SOG).

31. The method of claim 30 wherein said SOG is cured at a temperature between about 390° to 430° C.

32. The method of claim 27, wherein said CMP is accomplished with a slurry.

33. The method of claim 32, wherein said slurry consists of $SiO_2$ particles.

34. The method of claim 27, wherein said ion implanting is accomplished by means of high-energy implanter.

35. The method of claim 27, wherein said atoms are nitrogen.

36. The method of claim 35, wherein energy of said nitrogen atoms is between about 350 to 450 keV.

37. The method of claim 35, wherein the dose of said nitrogen atoms is between about $2\times10^4$ to $5\times10^4$ ions/cm$^2$.

38. The method of claim 35, wherein duration for implanting said nitrogen atoms is between about 50 to 70 seconds.

39. The method of claim 35, wherein implanting depth of said nitrogen atoms is between about 9,000 to 11,000 angstroms (Å).

40. The method of claim 27, wherein said polish stop layer has a hardness between about 8 to 9 in Mohs scale.

* * * * *